(12) United States Patent
Kim

(10) Patent No.: US 10,886,494 B2
(45) Date of Patent: Jan. 5, 2021

(54) DISPLAY ELEMENT

(71) Applicant: SAMSUNG DISPLAY CO., LTD., Yongin-si (KR)

(72) Inventor: Yool Guk Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 45 days.

(21) Appl. No.: 15/867,529

(22) Filed: Jan. 10, 2018

(65) Prior Publication Data

US 2019/0115560 A1 Apr. 18, 2019

(30) Foreign Application Priority Data

Oct. 17, 2017 (KR) .................. 10-2017-0134830

(51) Int. Cl.
*H01L 51/52* (2006.01)
*H01L 27/32* (2006.01)
*H01L 51/50* (2006.01)

(52) U.S. Cl.
CPC ...... *H01L 51/5209* (2013.01); *H01L 27/3246* (2013.01); *H01L 27/3258* (2013.01); *H01L 27/3262* (2013.01); *H01L 27/3265* (2013.01); *H01L 27/3276* (2013.01); *H01L 51/5012* (2013.01); *H01L 51/5056* (2013.01); *H01L 51/5088* (2013.01); *H01L 2251/558* (2013.01)

(58) Field of Classification Search
None
See application file for complete search history.

(56) References Cited

U.S. PATENT DOCUMENTS

| 2011/0309385 | A1* | 12/2011 | Nendai | H01L 51/5209 257/88 |
| 2014/0339514 | A1* | 11/2014 | Oh | H01L 51/5209 257/40 |
| 2014/0346449 | A1* | 11/2014 | Choi | H01L 27/3211 257/40 |
| 2016/0155983 | A1* | 6/2016 | Lee | H01L 51/5209 257/40 |

FOREIGN PATENT DOCUMENTS

| JP | 2005-93421 | 4/2005 |
| JP | 2011-249089 | 12/2011 |
| KR | 10-2014-0139820 | 12/2014 |

* cited by examiner

*Primary Examiner* — Nicholas J Tobergte
*Assistant Examiner* — Kien C Ly
(74) *Attorney, Agent, or Firm* — Lewis Roca Rothgerber Christie LLP

(57) ABSTRACT

A display element includes: a base substrate; a metal layer on the base substrate; a passivation film on the base substrate and covering the metal layer; an electrode on the passivation film and at least partially overlapping the metal layer; and a pixel defining film on the passivation film. The pixel defining film has an opening at least partially exposing the electrode, and portions of the electrode offset from the metal layer are below a portion of the electrode overlapping the metal layer such that trenches are defined in the opening.

20 Claims, 11 Drawing Sheets

DISPLAY ELEMENT

CROSS-REFERENCE TO RELATED APPLICATION

This application claims priority to and the benefit of Korean Patent Application No. 10-2017-0134830, filed on Oct. 17, 2017 in the Korean Intellectual Property Office, the entire disclosure of which is incorporated herein by reference.

BACKGROUND

1. Field

Aspects of embodiments of the present disclosure relate to a display element.

2. Description of the Related Art

An organic light-emitting display element is a self-emissive display element. The organic light-emitting display element, unlike a light-receiving display element, such as a liquid crystal display (LCD) element, does not require a backlight unit to produce an image and, thus, has been widely used in various electric/electronic products, such as smartphones, ultra-slim televisions (TVs), and the like that may desirably be thinned.

Recently, research has been conducted on a technique of forming an organic light-emitting layer by discharging an organic solution containing an organic light-emitting material to each pixel region by using a solution coating method, such as inkjet printing, and drying the organic solution.

As the resolution (or display resolution) of display devices increases, the amount of the organic solution discharged for each pixel decreases considerably. However, the smaller the discharge amount of the organic solution, the more difficult it becomes to control the thickness of the organic light-emitting layer.

SUMMARY

Exemplary embodiments of the present disclosure provide a display device with display elements having uniform or substantially uniform luminance by increasing the discharged amount of an organic solution for forming an organic light-emitting layer (e.g., by increasing a wetting margin) to more easily control a thickness of the organic light-emitting layer.

However, exemplary embodiments of the present disclosure are not limited to the exemplary embodiments set forth herein. The above and other exemplary embodiments of the present disclosure will become more apparent to one of ordinary skill in the art to which the present disclosure pertains by referencing the detailed description of the present disclosure below.

According to an exemplary embodiment of the present disclosure, a display element includes: a base substrate; a metal layer on the base substrate; a passivation film on the base substrate and covering the metal layer; an electrode on the passivation film and at least partially overlapping the metal layer; and a pixel defining film on the passivation film. The pixel defining film has an opening at least partially exposing the electrode, and portions of the electrode offset from the metal layer are below a portion of the electrode overlapping the metal layer such that trenches are defined in the opening.

According to the aforementioned and other exemplary embodiments of the present disclosure, trenches are formed in each opening defined in a pixel defining film of a display element. Accordingly, a discharge amount of an organic solution (e.g., the wetting margin) is increased. As a result, a thickness of an organic light-emitting layer can be more easily controlled and luminance uniformity is improved.

Other features and aspects of exemplary embodiments of the present disclosure may be apparent from the following detailed description, the drawings, and the claims.

BRIEF DESCRIPTION OF THE DRAWINGS

The above and other aspects and features of exemplary embodiments of the present disclosure will become more apparent by describing, in detail, exemplary embodiments thereof with reference to the attached drawings, in which.

DETAILED DESCRIPTION

Figure 1:
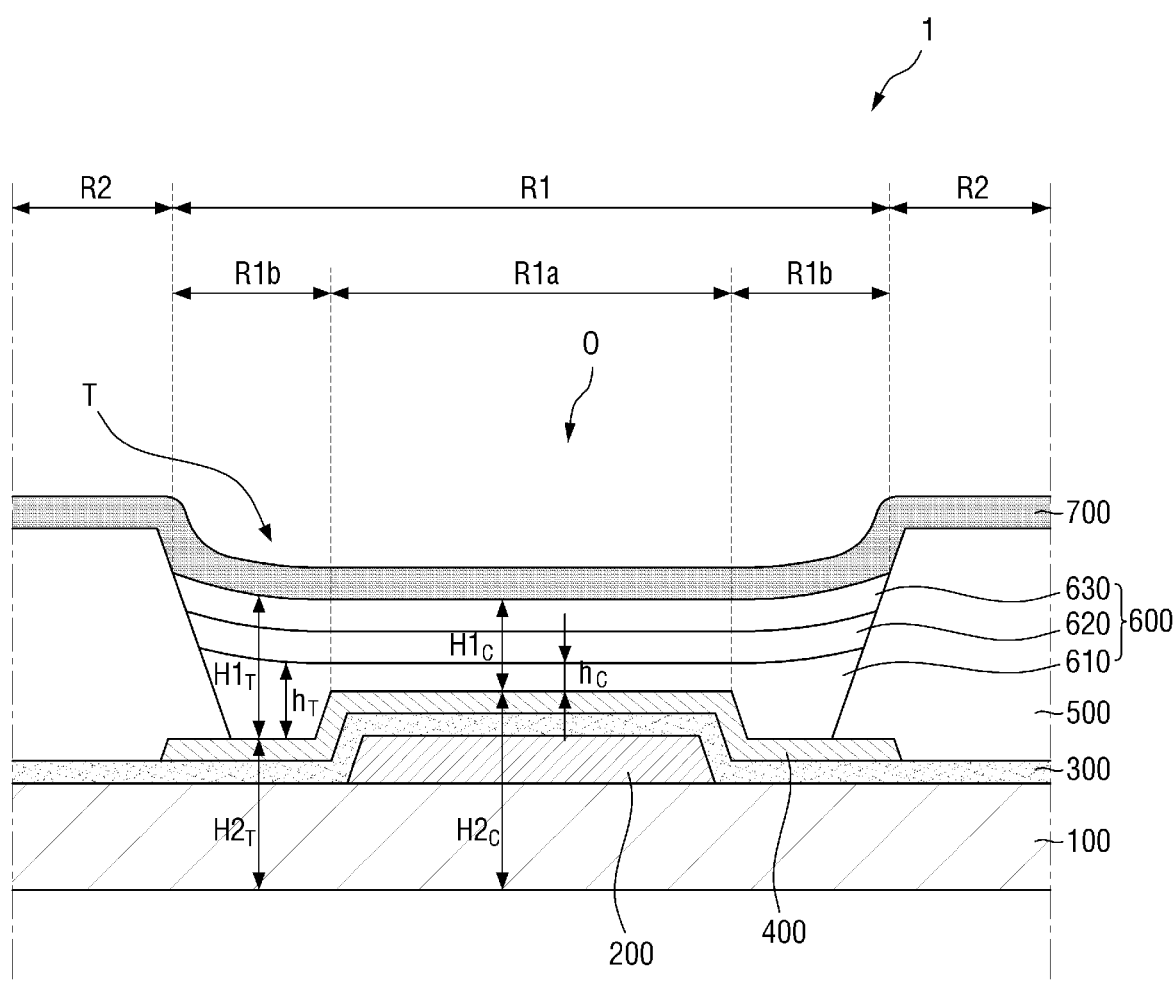
FIG. 1 is a cross-sectional view of a display element according to an exemplary embodiment of the present disclosure.

Aspects and features of exemplary embodiments of the present disclosure and methods of accomplishing the same may be understood more readily by reference to the following detailed description and the accompanying drawings. The present disclosure may, however, be embodied in many different forms and should not be construed as being limited to the exemplary embodiments set forth herein. Rather, these embodiments are provided so that this disclosure will be thorough and complete and will fully convey the concept of the present disclosure to those skilled in the art. The present disclosure is defined by the appended claims and their equivalents.

It will be understood that when an element or layer is referred to as being "on," "connected to," or "coupled to" another element or layer, the element or layer can be directly on, connected, or coupled to another element or layer or intervening elements or layers may be present. When an element is referred to as being "directly on," "directly connected to," or "directly coupled to" another element or layer, there are no intervening elements or layers present. As used herein, connected and coupled may refer to elements being physically, electrically, and/or fluidly connected to each other.

The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc., may be used herein to describe various elements, components, regions, layers and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

The term "display element", as used herein, denotes, but is not limited to, an organic light-emitting display element of an organic light-emitting display device and also denotes various other display elements to which exemplary embodiments of the present disclosure are applicable.

Exemplary embodiments of the present disclosure will hereinafter be described.

FIG. 1 is a cross-sectional view of a display element according to an exemplary embodiment of the present disclosure.

Referring to FIG. 1, a display element 1 includes a base substrate 100, a metal layer 200, a passivation film 300, a first electrode 400, a pixel defining film 500, an organic layer 600, and a second electrode 700.

The base substrate 100 may provide a space on which the metal layer 200, the passivation film 300, and the pixel defining film 500 are arranged and may, thus, support the elements of the display element 1. A top surface of the base substrate 100 may be a base surface for the metal layer 200 and the like (e.g., the metal layer 200 may be on the top surface of the base substrate 100).

The metal layer 200 is disposed on the base substrate 100. The metal layer 200 may be at least a portion (e.g., a part) of a metal pattern layer formed on the base substrate 100. In one exemplary embodiment, the metal layer 200 may be a gate metal layer or a data metal layer included in a thin-film transistor (TFT) substrate of the display element 1. The gate metal layer may be a metal pattern layer including a gate wiring and a gate electrode that forms a TFT, and the data metal layer may be a metal pattern layer including a data wiring and source and drain electrodes that also form a TFT. However, the metal layer 200 is not limited to this exemplary embodiment.

In an embodiment in which the metal layer 200 is the gate metal layer or the data metal layer, at least the portion of the base substrate 100 may be referred to as a TFT substrate of the display element 1. For example, the base substrate 100 may be a glass substrate or a polymer substrate, which is the base layer of the TFT substrate, or may be a buffer layer or an insulating layer that directly supports (e.g., directly contacts) the gate metal layer or the data metal layer. In an embodiment in which the metal layer 200 is the gate metal layer, the base substrate 100 may encompass or include the base layer of the TFT substrate and the insulating layer that directly supports the gate metal layer, and in an embodiment in which the metal layer 200 is the data metal layer, the base substrate 100 may encompass the base layer of the TFT substrate and the insulating layer that directly supports the data metal layer.

The base substrate 100 and the metal layer 200 will be further described below with reference to FIGS. 4-11.

The passivation film 300 is disposed on the base substrate 100 to cover the metal layer 200. The passivation film 300 may be a film that electrically insulates the metal layer 200 and the first electrode 400 (e.g., that electrically insulates the metal layer 200 and the first electrode 400 from each other).

Due to the metal layer 200, a portion of the passivation film 300 covering the metal layer 200 may protrude beyond (or above) other portions of the passivation film 300 covering the base substrate 100 (e.g., the other portions of the passivation film 300 offset from the metal layer 200). For example, the portion of the passivation film 300 disposed on the metal layer 200 may be higher (e.g., may be further above the top surface of the base substrate 100) than the portions of the passivation film 300 disposed on the base substrate 100. In this embodiment, the thickness of the portion of the passivation film 300 disposed on the metal layer 200 may be substantially the same as the thickness of the portions of the passivation film 300 disposed on the base substrate 100.

The passivation film 300 may include an inorganic material. In one embodiment, the passivation film 300 may include at least one of silicon nitride ($SiN_x$), silicon oxide ($SiO_x$), and silicon oxynitride ($SiO_xN_y$), but the type of the material of the passivation film 300 is not particularly limited. In an embodiment in which the passivation film 300 is formed of an inorganic material, the passivation film 300 may be formed to have a uniform thickness not only in a region where the metal layer 200 is disposed but also in regions where the metal layer 200 is not disposed (e.g., at regions outside of the metal layer 200).

The first electrode 400 is disposed on the passivation film 300. The first electrode 400 may be a pixel electrode (e.g., an anode) of the display element 1.

The first electrode 400 may include a conductive material with a high work function. For example, the first electrode 400 may include a transparent conductive oxide (TCO), such as indium tin oxide (ITO), indium zinc oxide (IZO), zinc oxide (ZnO), and/or indium oxide ($In_2O_3$). The first electrode 400 may have a stacked structure including a layer formed of a TCO and a conductive material layer formed of a reflective metal, such as lithium (Li), calcium (Ca), aluminum (Al), silver (Ag), magnesium (Mg), and/or gold (Au).

The first electrode 400 may partially overlap the metal layer 200. In the embodiment illustrated in FIG. 1, an inner portion (e.g., a middle or center portion) of the first electrode 400 may overlap the metal layer 200, and outer portions (e.g., edge portions) of the first electrode 400 may not overlap (e.g., may be offset from) the metal layer 200. However, the present disclosure is not limited to this example. In another embodiment, one side of the first electrode 400 may overlap the metal layer 200, and another side of the first electrode 400 may not overlap the metal layer 200. The arrangement of the first electrode 400 is not particularly limited as long as the first electrode 400 has both a portion overlapping the metal layer 200 and other portions not overlapping the metal layer 200.

As described above, the height of the portion of the first electrode 400 overlapping the metal layer 200 and the height of the portions of the first electrode 400 not overlapping the metal layer 200 may be different from each other because the height of the portion of the passivation film 300 covering the metal layer 200 and the height of the portions of the passivation film 300 not covering the metal layer 200 are different from each other. Accordingly, a distance $H2_C$ from a bottom surface of the base substrate 100 to a top surface of the portion of the first electrode 400 overlapping the metal layer 200 may be greater than a distance $H2_T$ from the bottom surface of the base substrate 100 to a top surface of the portions of the first electrode 400 not overlapping the metal layer 200.

The pixel defining film 500 is disposed on the passivation film 300. An opening O, which at least partially exposes the first electrode 400, may be formed in the pixel defining film 500. The opening O may be formed into a pattern corresponding to a corresponding pixel.

Portions of the first electrode 400 exposed by the opening O may include both the portion of the first electrode 400 overlapping the metal layer 200 and the portions of the first electrode 400 not overlapping the metal layer 200. In the embodiment shown in FIG. 1, the portions of the first electrode 400 not overlapping the metal layer 200 may be at outer sides of the opening O, and the portion of the first electrode 400 overlapping the metal layer 200 may be at an inner portion (e.g., a middle or center portion) of the opening O. Because the portions of the first electrode 400 not overlapping (e.g., offset from) the metal layer 200 are below the portion of the first electrode 400 that overlaps the metal layer 200 (e.g., because there is a step difference between the portions of the first electrode 400 offset from the metal layer 200 and the portion of the first electrode 400 that overlaps the metal layer 200), trenches T may be formed in the opening O of the display element 1. The trenches T are present between the inner portion of the first electrode 400 that overlaps the metal layer 200 and the pixel defining film 500 and are recesses over the outer portions of the first electrode 400 that are offset from the metal layer 200.

The trenches T may be formed at an edge of the opening O. For example, the trenches T may be formed on only one side of (e.g., along only a portion of a periphery of) the opening O or on all sides of (e.g., along the entire periphery of) the opening O.

End portions of the first electrode 400 may be disposed below the pixel defining film 500 and may be covered by the pixel defining film 500. Because the end portions of the first electrode 400 are covered by the pixel defining film 500, the first electrode 400 may not be peeled off or damaged.

The organic layer 600 is disposed on the portions of the first electrode 400 exposed by the opening O. The organic layer 600 may include an organic light-emitting material that emits light by generating excitons in response to a voltage applied thereto. The organic layer 600 may be formed in the opening O by discharging a solution into the opening O by a solution coating method, such as inkjet printing, and drying the solution. The solution may be discharged to fill a space in the opening O (e.g., to partially fill the opening).

The organic layer 600 may be relatively thick along the edges of the opening O (e.g., may be thicker in the trenches T than in the rest of the opening O). For example, a thickness $H1_T$ of portions of the organic layer 600 disposed in the trenches T may be greater than a thickness $H1_C$ of the rest of the organic layer 600.

The height of a bottom surface of the organic layer 600 above the base substrate 100 varies in accordance with the height of the first electrode 400 above the base substrate 100, but a top surface of the organic layer 600 is relatively flat. Accordingly, the thickness of portions of the organic layer 600 disposed on the portions of the first electrode 400 not overlapping the metal layer 200 may be different from the thickness of a portion of the organic layer 600 disposed on the portion of the first electrode 400 overlapping the metal layer 200.

In order to provide a high-resolution display device, the size of the opening O of the display element 1, which is formed in the pixel defining film 500, should be relatively small. Thus, in order to form the organic layer 600 through the discharge of a solution including an organic light-emitting material, a relatively very small amount of the solution should be discharged into the opening O. Accordingly, the thickness of the organic layer 600, which is formed by drying the solution, and an amount of light emitted from the organic layer 600 (e.g., a luminance of the organic layer 600) may not be easily controlled.

In the exemplary embodiment shown in FIG. 1, the thickness of the organic layer 600 may be more easily controlled by forming the trenches T in the opening O and increasing the discharged amount of the solution to form the organic layer 600, (e.g., by increasing the wetting margin).

In a plan view, the display element 1 may have a first region R1 in which the organic layer 600 is disposed and a second region R2 in which the organic layer 600 is not disposed. The first region R1 may be divided into a "1-1" region R1a in which the trenches T are not defined and "1-2" regions R1b in which the trenches T are defined.

Because the organic layer 600 is relatively thin in the "1-1" region R1a outside of the trenches T, the first and second electrodes 400 and 700 are relatively close to each other, and as a result, the organic layer 600 emits light in the "1-1" region R1a. Because the organic layer 600 is relatively thick in the "1-2" regions R1b, the organic layer 600 may not be able to emit light in the "1-2" regions R1b. Thus, the "1-1" region R1a may be a light-emitting region, and the "1-2" regions R1b may be non-light-emitting regions. Because an inner portion of the organic layer 600 (e.g., the portion of the organic layer 600 disposed in the "1-1" region R1a) may have a more uniform thickness than an organic layer of a conventional display element, the uniformity of luminance in the "1-1" region R1a (e.g., the light-emitting region) is improved.

In an embodiment in which the organic layer 600 is an organic light-emitting layer, the organic layer 600 may have a multilayer structure including a hole injection layer 610, a hole transport layer 620, and/or an emission layer 630.

The hole injection layer 610 may include, for example, a phthalocyanine compound such as copper phthalocyanine (CuPc), 4,4',4"-tris(N-3-methylphenyl-N-phenylamino)triphenylamine (m-MTDATA), 4,4',4"-tris(diphenylamino)triphenylamine (TDATA), 4,4',4"-tris[2-naphthyl(phenyl)-amino]triphenyl-amine (2-TNATA), Polyaniline/Dodecylbenzenesulfonic acid (Pani/DBSA), Poly(3,4- ethylene dioxythiophene)/Polystyrene sulfonate (PEDOT/PSS), Polyaniline/Camphorsulfonic acid (PANI/CSA), or Polyaniline/Polystyrene sulfonate (PANI/PSS), but the present disclosure is not limited thereto.

The hole transport layer 620 may include, for example, 4,4'-bis[N-(1-napthyl)-N-phenylamino]biphenyl (NPD), N,N'-diphenyl-N,N'-bis[3-methylphenyl]-1,1'-biphenyl-4,4'-diamine (TPD), 2,2',7,7'-tetrakis-(N,N-diphenylamino)-9,9'-spirobifluoren (s-TAD), or 4,4',4"-tris(N-3-methylphenyl-N-phenylamino)triphenylamine (m-MTDATA), but the present disclosure is not limited thereto.

The emission layer 630 may include a host and a dopant. For example, tris-(8-hydroxyquinoline)aluminum(III) (Alq3), 4,4'-N,N'-dicarbazole-biphenyl (CBP), poly(N-vinylcarbazole) (PVK), 9,10-bis(2-naphthalenyl)anthracene (ADN), 4,4',4"-tris(N-carbazolyl)triphenylamine (TCTA), 1,3,5-tris(N-phenylbenzimiazole-2-yl)benzene (TPBi), 2-(t-butyl)-9, 10-bis (20-naphthyl) anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN) may be used as the host, and a fluorescent dopant or a phosphorescent dopant may be used as the dopant.

The organic layer 600 may further include at least one of an electron transport layer and an electron injection layer disposed on the emission layer 630, but the present disclosure is not limited thereto.

In an embodiment in which the organic layer 600 includes the hole injection layer 610, the hole transport layer 620, and the emission layer 630, only the hole injection layer 610 may have different a thickness in the "1-1" region R1$a$ than in the "1-2" regions R1$b$, and the hole transport layer 620 and the emission layer 630 may have a relatively uniform thickness in the "1-1" region R1$a$ and the "1-2" regions R1$b$. Accordingly, a thickness $h_T$ of the hole injection layer 610 in the "1-2" regions R1$b$ may be greater than a thickness $h_C$ of the hole injection layer 610 in the "1-1" region R1$a$.

The second electrode 700 is disposed on the organic layer 600. The second electrode 700 may be disposed to cover only a portion of a surface of the pixel defining film 500 or may cover the entire surface of the pixel defining film 500. The second electrode 700 may be a common electrode (e.g., a cathode) of the display element 1.

The second electrode 700 may include a conductive material with a low work function. For example, the second electrode 700 may include a metal, such as lithium (Li), calcium (Ca), lithium fluoride/calcium (LiF/Ca), lithium fluoride/aluminum (LiF/Al), aluminum (Al), magnesium (Mg), silver (Ag), platinum (Pt), palladium (Pd), nickel (Ni), gold (Au), neodymium (Nd), iridium (Ir), chromium (Cr), barium fluoride (BaF), barium (Ba), ytterbium (Yb), or a compound or mixture thereof. The display element 1 may be a top emission-type display element 1, and the second electrode 700 may have a stacked structure including a thin film including a metal, such as Li, Ca, LiF/Ca, LiF/Al, Al, Mg, Ag, Pt, Pd, Ni, Au Nd, Ir, Cr, BaF, Ba, Yb, or a compound or mixture thereof, and a transparent conductive material, such as ITO, TCO, IZO, ZnO, or $In_2O_3$.

Figure 2:
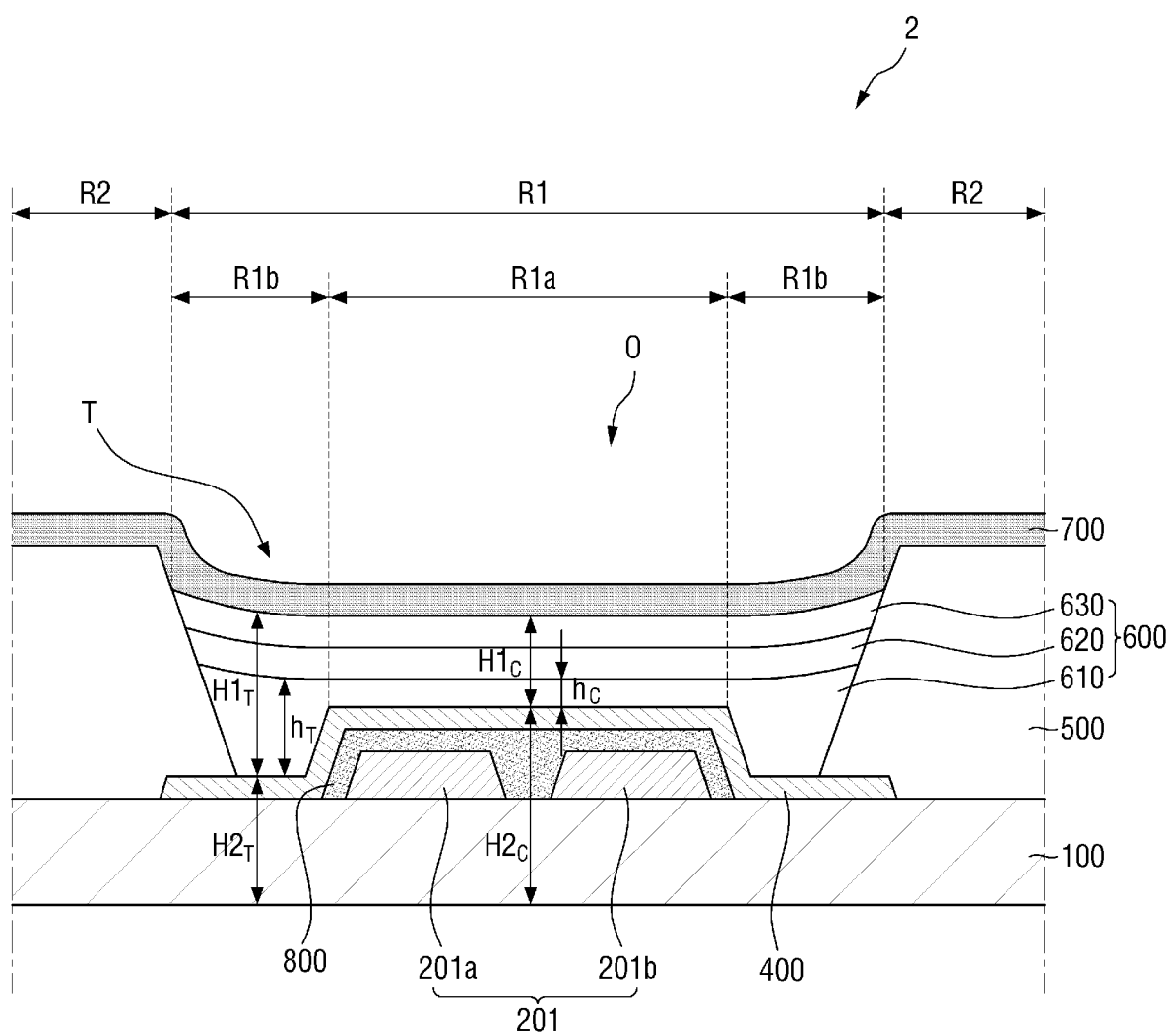
FIGS. 2 and 3 are cross-sectional views of display elements according to other exemplary embodiments of the present disclosure.

FIG. 2 is a cross-sectional view of a display element according to another exemplary embodiment of the present disclosure.

A display element 2 shown in FIG. 2 is substantially the same as the display element 1 shown in FIG. 1 except that the display element 2 includes a metal pattern layer 201 and a first passivation film 800 provided as a planarization film. Thus, the display element 2 shown in FIG. 2 will hereinafter be described so as to avoid redundant description of elements and/or features described above with respect to the display element 1 shown in FIG. 1.

Referring to FIG. 2, the metal pattern layer 201 may be disposed on a base substrate 100 shown in the display element 2, and the metal pattern layer 201 may include a plurality of metal layers 201$a$ and 201$b$ spaced from (e.g., spaced apart from) each other, instead of the metal layer 200 shown in FIG. 1.

The metal pattern layer 201 may be a portion of a gate metal layer or a data metal layer. For example, the metal pattern layer 201 may be a patterned portion of the gate metal layer or the data metal layer, but the present disclosure is not limited thereto. The metal pattern layer 201 may be a plurality of metal layers that are spaced from one another or may be an integral metal layer having a different height from one area to another area.

The first passivation film 800 may be disposed on the base substrate 100 to cover the metal pattern layer 201. The first passivation film 800 may be provided as a planarizing film to planarize a top of the metal pattern layer 201. For example, top surfaces of portions of the first passivation film 800 covering the metal layers 201$a$ and 201$b$ may have substantially the same height above the base substrate 100 as the height of the top surfaces of portions of the first passivation film 800 above the base substrate 100 not covering the metal layers 201$a$ and 201$b$. Accordingly, the portions of the first passivation layer 800 covering the metal layers 201$a$ and 201$b$ may have a different thickness from the portions of the first passivation layer 800 not covering the metal layers 201$a$ and 201$b$.

The first passivation film 800 may include an organic material. In one exemplary embodiment, the first passivation film 800 may include at least one of benzocyclobutene (BCB), polyimide (PI), polyacryl (PA), and siloxane, but the type of the organic material of the first passivation film 800 is not particularly limited. In an embodiment in which the first passivation film 800 is formed of an organic material, the first passivation film 800 may planarize the top of the metal pattern layer 201.

The first passivation film 800 may be disposed only in the opening O of the pixel defining film 500. For example, the first passivation film 800 may be disposed only in a portion of the opening O (e.g., only at an inner side or center portion of the opening O). Also, the first electrode 400 may be disposed on the base substrate 100 to cover the first passivation film 800. Accordingly, because the height of a portion of the first electrode 400 above the base substrate 100 disposed on the first passivation film 800 differs from the height of other portions of the first electrode 400 above the base substrate 100 not disposed on (e.g., offset from) the first passivation film 800, trenches T may be formed, as described above with reference to FIG. 1.

Figure 3:
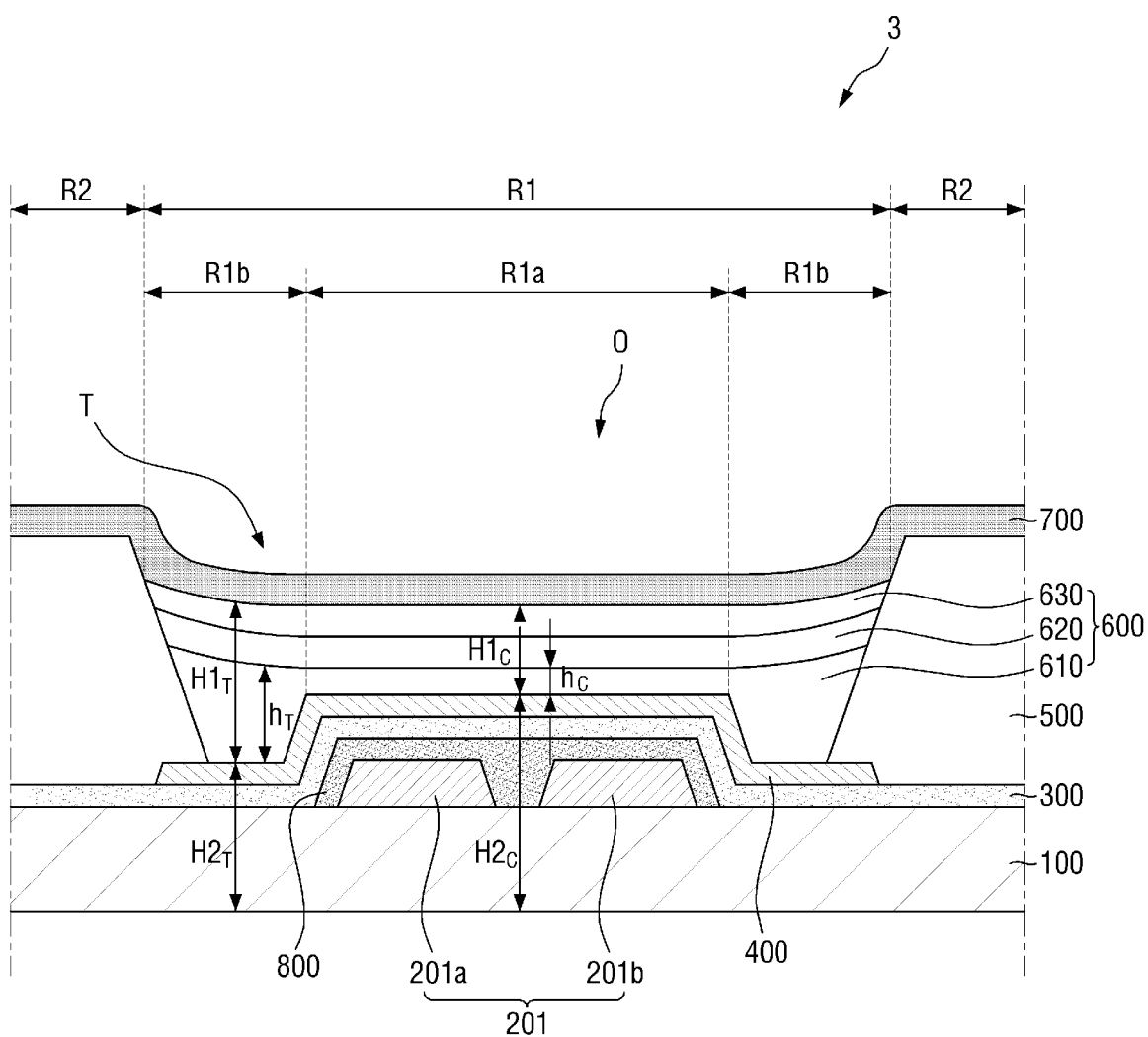

FIG. 3 is a cross-sectional view of a display element according to another exemplary embodiment of the present disclosure.

A display element 3 of FIG. 3 is substantially the same as the display element 2 of FIG. 2 except that it further includes a second passivation film 300 including an inorganic material. Thus, the display element 3 of FIG. 3 will be described so as to avoid redundant description of elements and/or features described above with respect to the display element 2 shown in FIG. 2.

Referring to FIG. 3, the display element 3 may include the first passivation film 800, which includes an organic material, and the second passivation film 300, which includes an inorganic material. For example, the first passivation film 800 may be disposed to planarize the top surface of a metal pattern layer 201, and the second passivation film 300 may be disposed between the first passivation film 800 and a first electrode 400.

Examples of the display elements 1, 2, and 3 will hereinafter be described. The examples of the display elements 1, 2, and 3, however, are merely exemplary, and thus, the present disclosure is not limited thereto.

Figure 4:
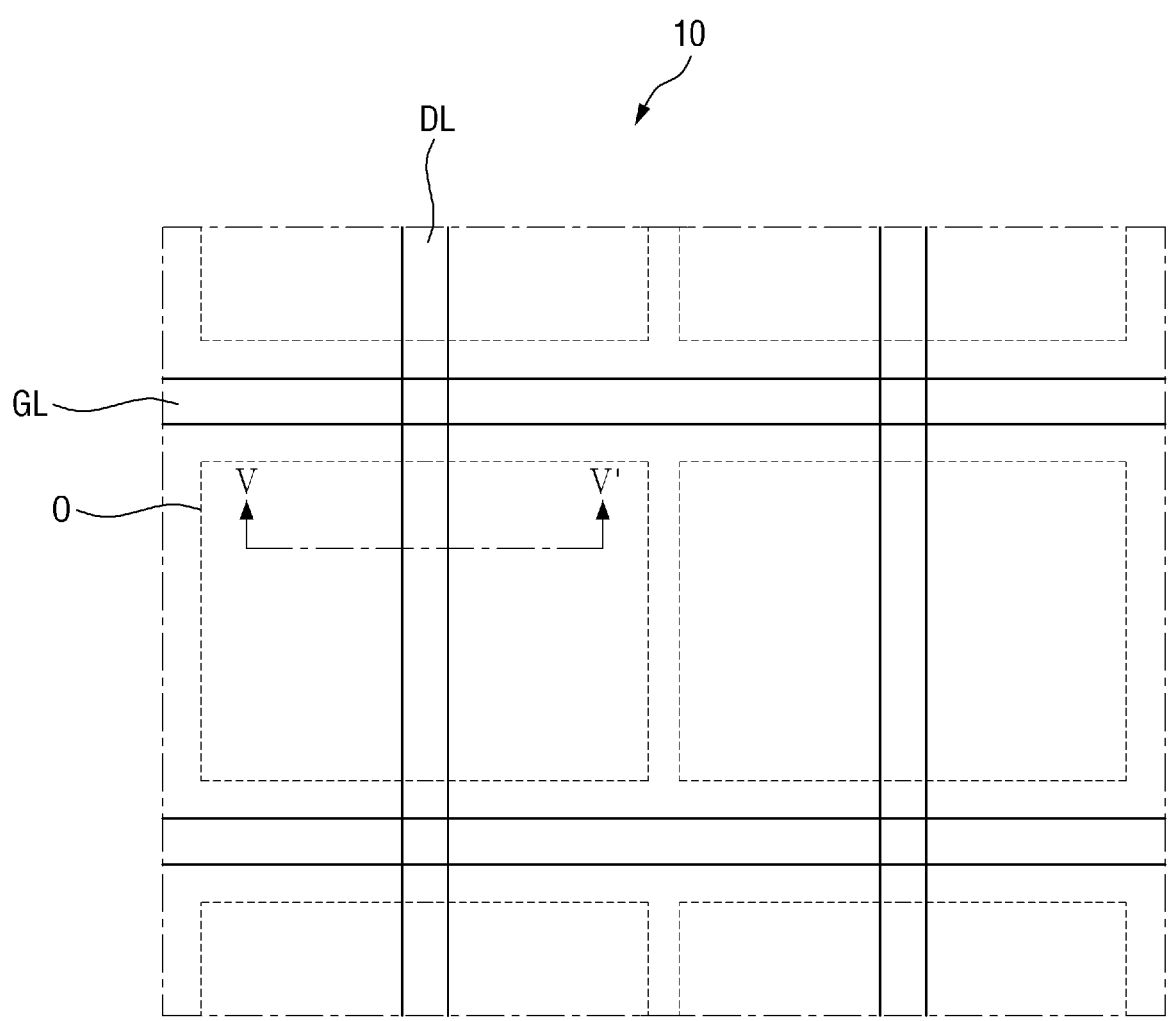
FIG. 4 is a plan view of a display device according to an exemplary embodiment of the present disclosure.
Figure 5:
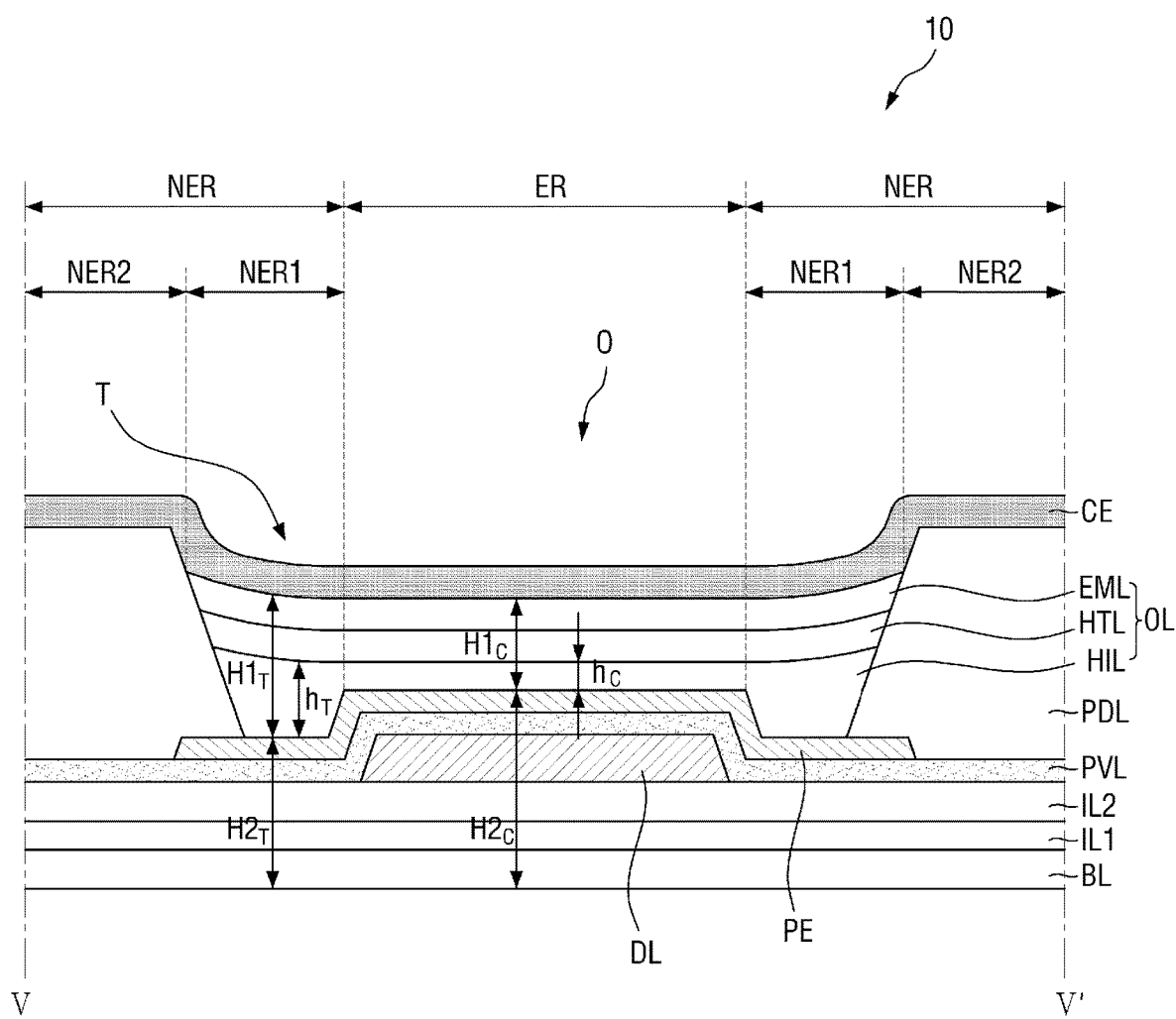
FIG. 5 is a cross-sectional view taken along the line V-V' of FIG. 4.

FIG. 4 is a plan view of a display device according to an exemplary embodiment of the present disclosure, and FIG. 5 is a cross-sectional view taken along the line V-V' of FIG. 4 showing a display element 10.

Referring to FIG. 4, a display device may include a plurality of gate lines GL and a plurality of data lines DL. The gate lines GL and the data lines DL may cross each other to form a matrix.

In a plan view, a plurality of openings O, which are formed in a pixel defining film PDL, may be defined in the display device as a particular pattern. The pixel defining film PDL may define a plurality of pixels in the display device using (or according to) the openings O. The openings O are illustrated as being rectangular in shape in the plan view, but the shape of the openings O is not particularly limited. For example, in another embodiment, the openings O may have a closed curve shape or a rectangular shape with rounded corners.

The openings O may be defined to partially overlap the data lines DL. The data lines DL are illustrated as extending across the centers of the openings O, but the present disclosure is not limited thereto. For example, in other embodiments, the data lines DL may extend across edges of the openings O rather than the centers of the openings O.

The display element 10 may be a top emission-type display element that outputs an image in an upward direction. Thus, an image output by the display element 10 may not be affected even if the data line DL, which is disposed at a lower portion of the display element 10, is formed of a non-transparent metal and overlaps with the opening O.

Referring to FIG. 5, the display element 10 may include a base layer BL, a first insulating layer IL1, a second insulating layer IL2, a data line DL, a passivation film PVL, a pixel electrode PE, the pixel defining film PDL, an organic layer OL, and a common electrode CE.

The base layer BL is a layer supporting the elements of the display element 10 and may include a transparent glass or plastic material.

The first and second insulating layers IL1 and IL2 may be disposed on top of the base layer BL. A semiconductor layer may be disposed between the base layer BL and the first insulating layer IL1, and a gate metal layer including a gate line may be disposed between the first and second insulating layers IL1 and IL2.

The data line DL may be disposed on the first insulating layer IL1, the passivation film PVL may be disposed to cover the data line DL, and the pixel electrode PE may be disposed on the passivation film PVL such that it partially overlaps the data line DL. The data line DL corresponds to the metal layer 200 shown in FIG. 1. As described above with reference to FIG. 1, the data line DL may cause a height difference between portions of the passivation film PVL and portions of the pixel electrode PE and, thus, trenches T may be formed in the opening O.

A stack of the base layer BL, the first insulating layer IL1, and the second insulating layer IL2 may correspond to the base substrate 100 shown in FIG. 1.

The pixel defining film PDL, the organic layer OL, and the common electrode CE are as described above with reference to FIG. 1, and thus, detailed descriptions thereof may be omitted.

A region where the organic layer OL is disposed and the trenches T are not defined may be defined as an emission region ER, regions where the organic layer OL is disposed and the trenches T are defined may be defined as first non-emission regions NER1, and regions where the organic layer OL is not disposed may be defined as second non-emission regions NER2. The first non-emission regions NER1, like the second non-emission regions NER2, may be regions where light emission does not occur, but the present disclosure is not limited thereto. In other embodiments, the first non-emission regions NER1 may be regions having an intermediate emission amount or a luminance between the emission amounts or the luminances of the emission region ER and the second non-emission regions NER2.

Figure 6:
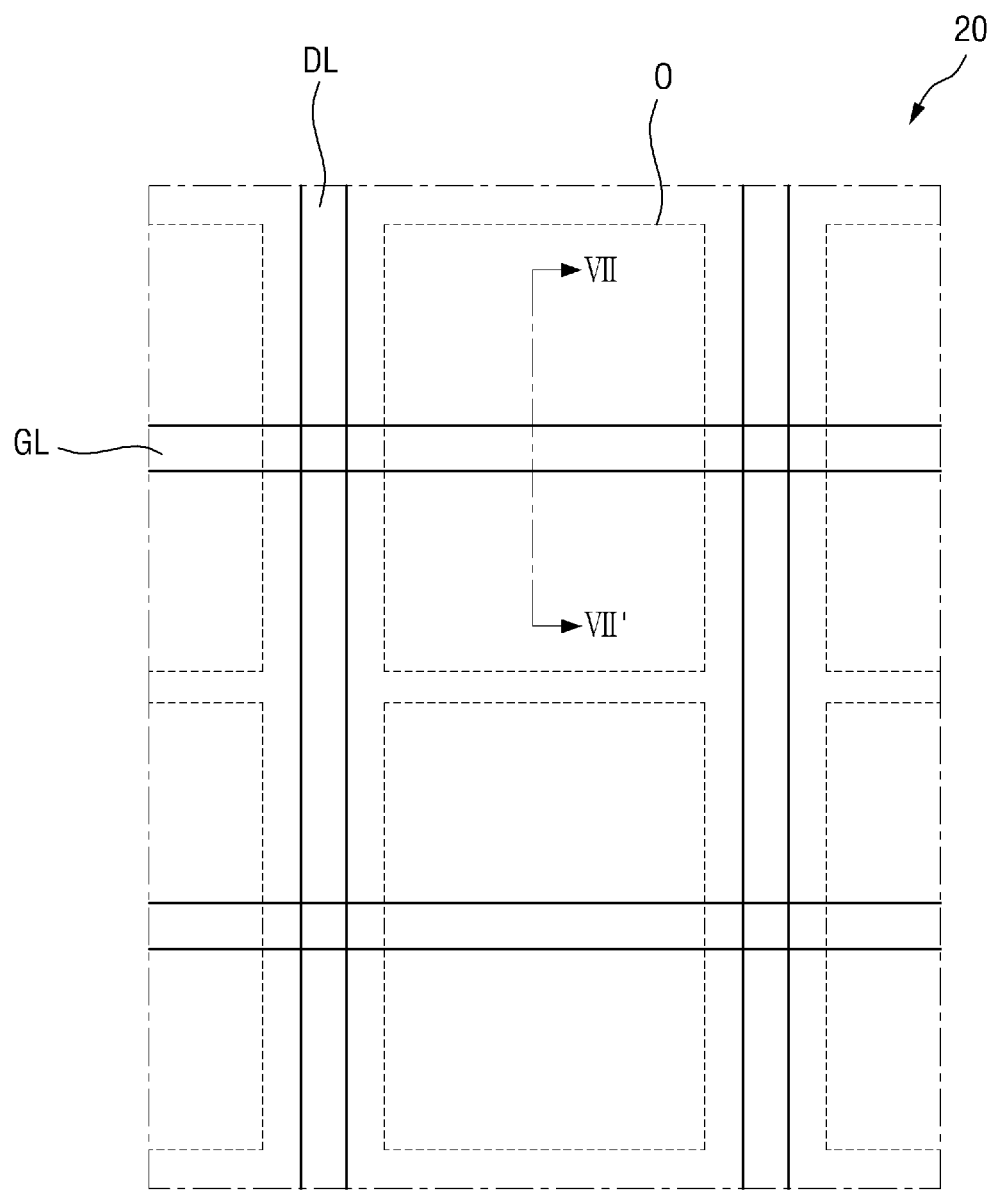
FIG. 6 is a plan view of a display device according to another exemplary embodiment of the present disclosure.
Figure 7:
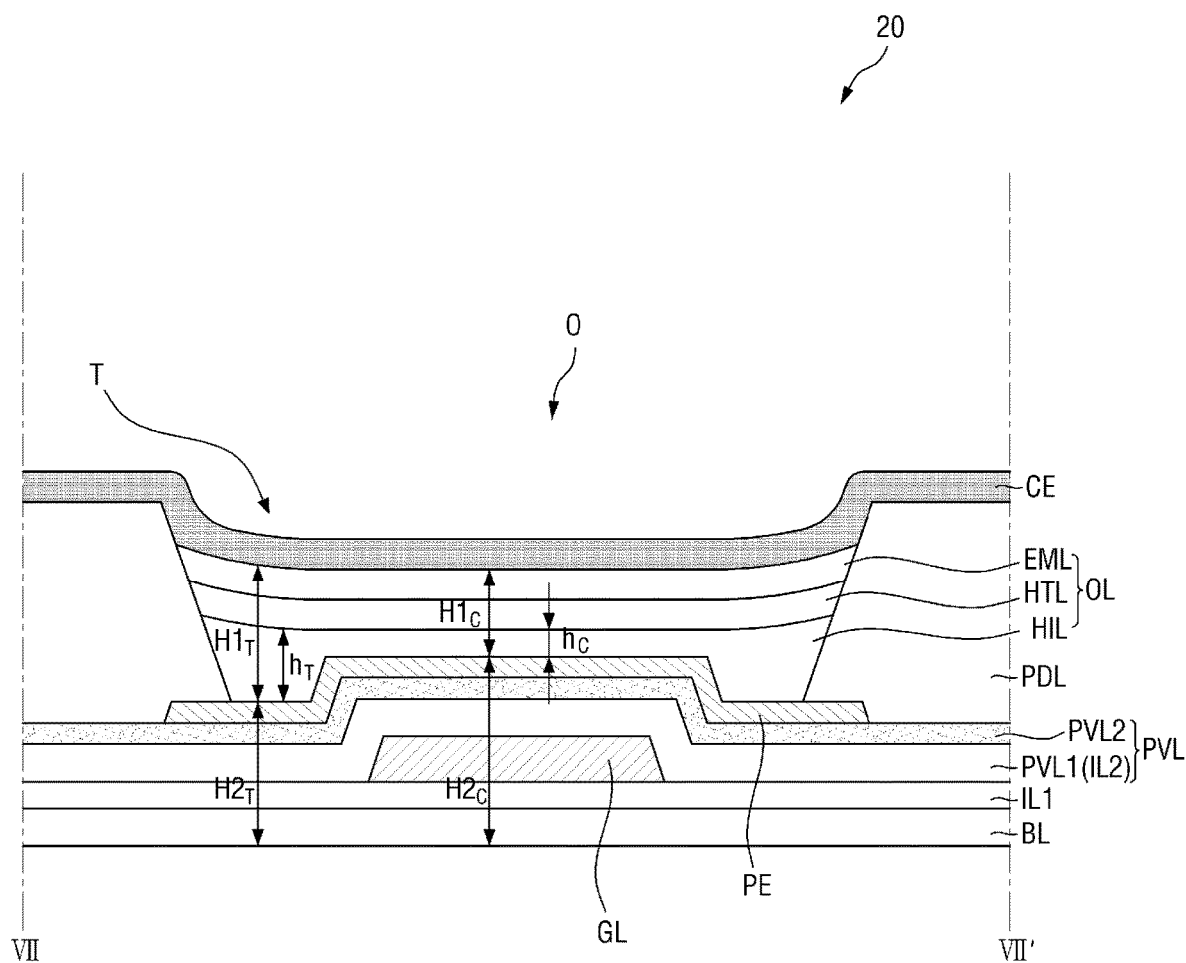
FIG. 7 is a cross-sectional view taken along the line VII-VII' of FIG. 6.

FIG. 6 is a plan view of a display device according to another exemplary embodiment of the present disclosure, and FIG. 7 is a cross-sectional view taken along the line VII-VII' of FIG. 6.

A display element 20 shown in FIGS. 6 and 7 is substantially the same as the display element 10 shown in FIGS. 4 and 5 except that openings O overlap the gate lines GL. Thus, the display element 20 shown in FIGS. 6 and 7 will hereinafter be described so as to avoid redundant description of elements and/or features described above with respect to the display element 10 shown in FIGS. 4 and 5.

Referring to FIG. 6, the openings O may be defined to partially overlap the gate lines GL. The gate lines GL are illustrated as extending across the centers of the openings O, but the present disclosure is not limited thereto. For example, in other embodiments, the gate lines GL may extend across the edges of the openings O rather than the centers of the openings O.

The display element 20 may be a top emission-type display element outputting an image in an upward direction. Thus, the output of an image from the display element 20 may not be affected even if the gate line GL, which is disposed at a lower portion of the display element 20, is formed of a non-transparent metal and overlap with the opening O.

Referring to FIG. 7, a gate line GL may be disposed on a first insulating layer IL1, and a second insulating layer IL2, a passivation film PVL2, and a pixel electrode PE may be disposed on the gate line GL. The gate line GL corresponds to the metal layer 200 shown in FIG. 1. As described above with reference to FIG. 1, the gate line GL may cause a height difference between portions of each of the second insulating layer IL2, the passivation film PVL2, and the pixel electrode PE and thus, trenches T may be formed in the opening O.

The second insulating layer IL2 and the passivation film PVL2 may be defined as a first passivation film PVL1 and a second passivation film PVL2, respectively, and a stack of the first and second passivation films PVL1 and PVL2 may correspond to the passivation film PVL shown in FIG. 1. A stack of the base layer BL and the first insulating layer IL1 may correspond to the base substrate 100 shown in FIG. 1.

Figure 8:
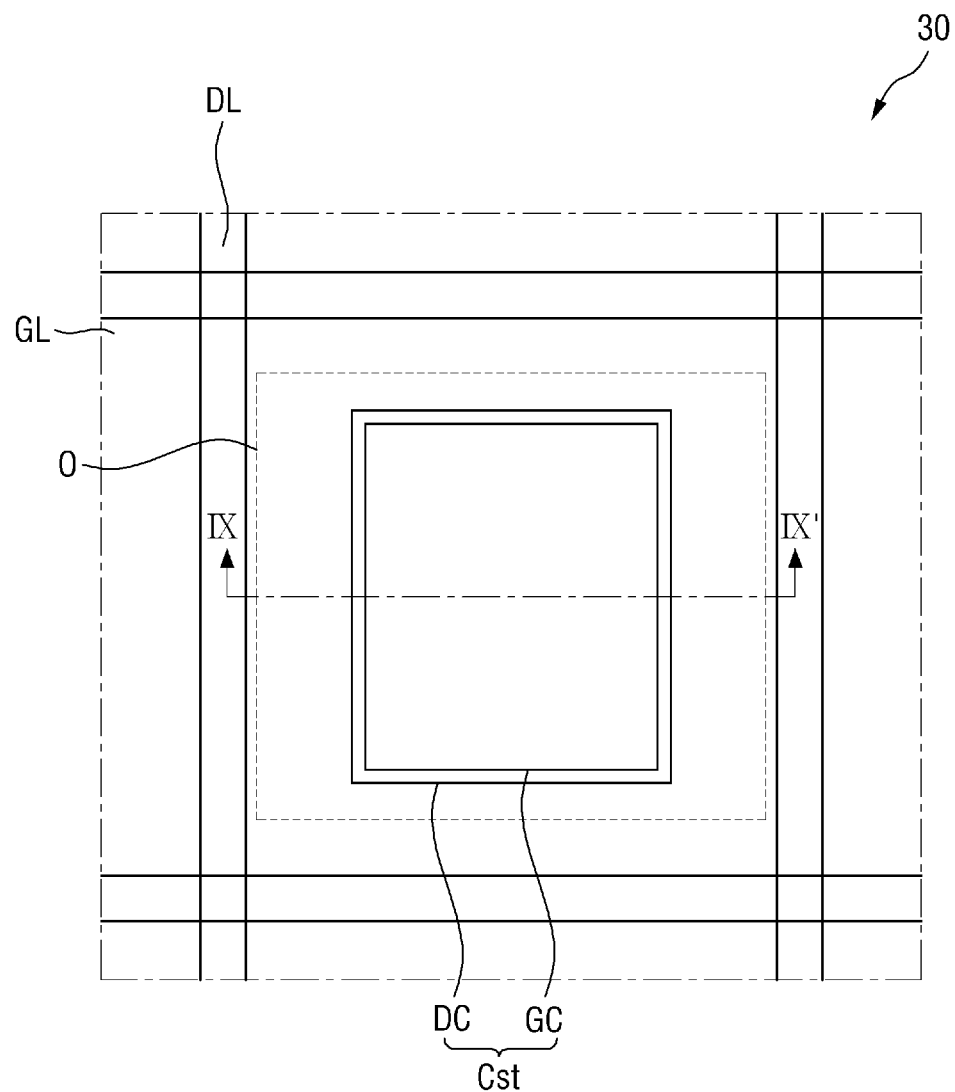
FIG. 8 is a plan view of a display device according to another exemplary embodiment of the present disclosure.
Figure 9:
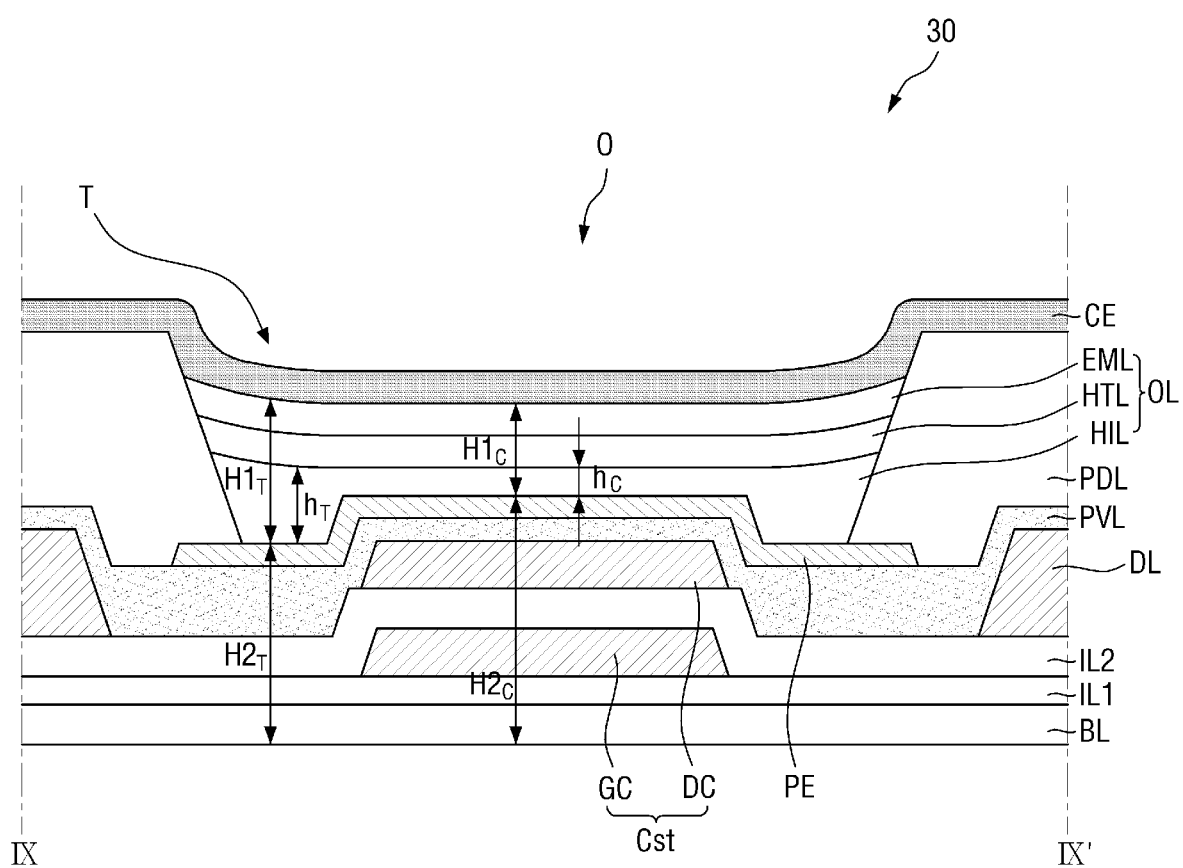
FIG. 9 is a cross-sectional view taken along the line IX-IX' of FIG. 8.

FIG. 8 is a plan view of a display device according to another exemplary embodiment of the present disclosure, and FIG. 9 is a cross-sectional view taken along the line IX-IX' of FIG. 8.

A display element 30 shown in FIGS. 8 and 9 is substantially the same as the display element 10 shown in FIGS. 4 and 5 except that a portion of each opening O overlaps a capacitor Cst.

Referring to FIG. 8, each opening O may be disposed in a region defined by a plurality of gate lines GL and a plurality of data lines DL crossing each other, and a portion of each opening O may overlap a capacitor Cst.

Referring to FIG. 9, a gate metal GC, which is disposed on a first insulating layer IL1, and a data metal DC, which is disposed on a second insulating layer IL2, may be disposed to overlap each other and may, thus, form a capacitor Cst. The capacitor Cst corresponds to the metal layer 200 shown in FIG. 2. As described above with reference to FIG. 1, the capacitor Cst may cause a height difference between portions of each of the first insulating layer IL1, a passivation film PVL, and a pixel electrode PE and, thus, trenches T may be formed in the opening O.

Figure 10:
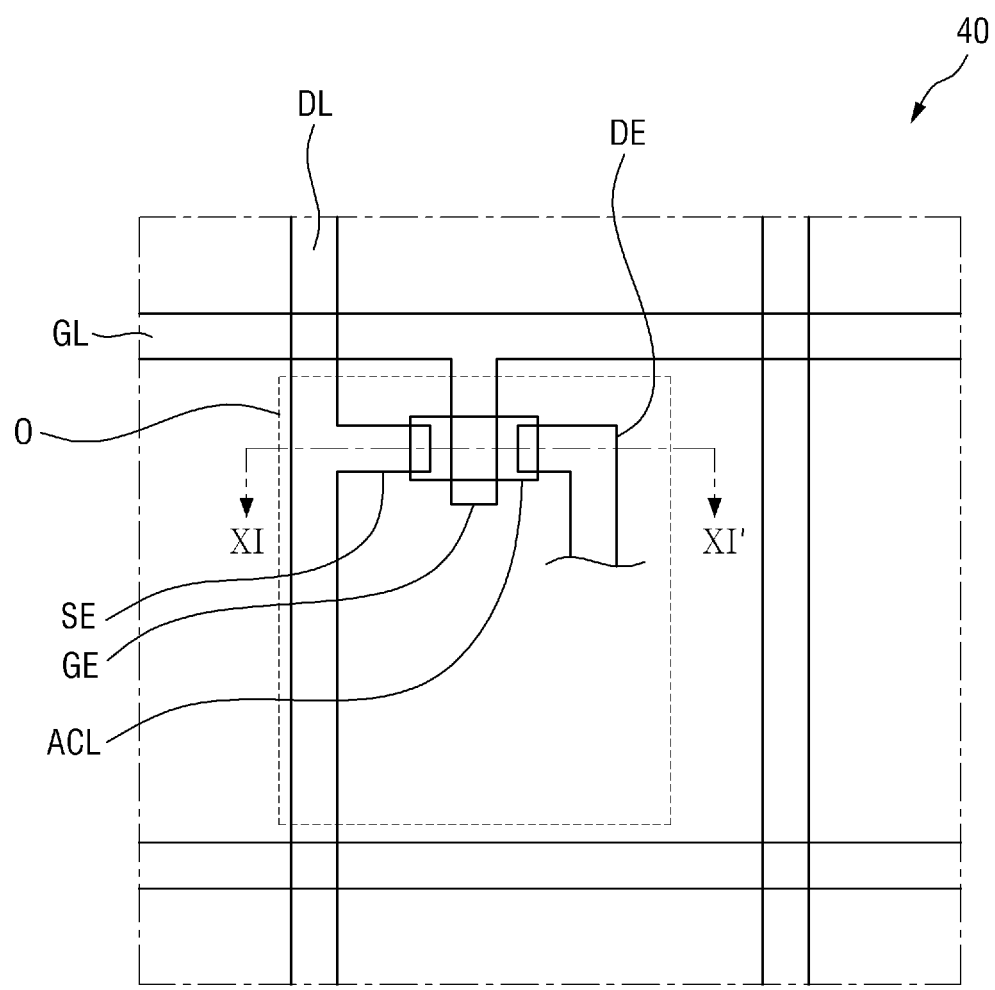
FIG. 10 is a plan view of a display device according to another exemplary embodiment of the present disclosure.
Figure 11:
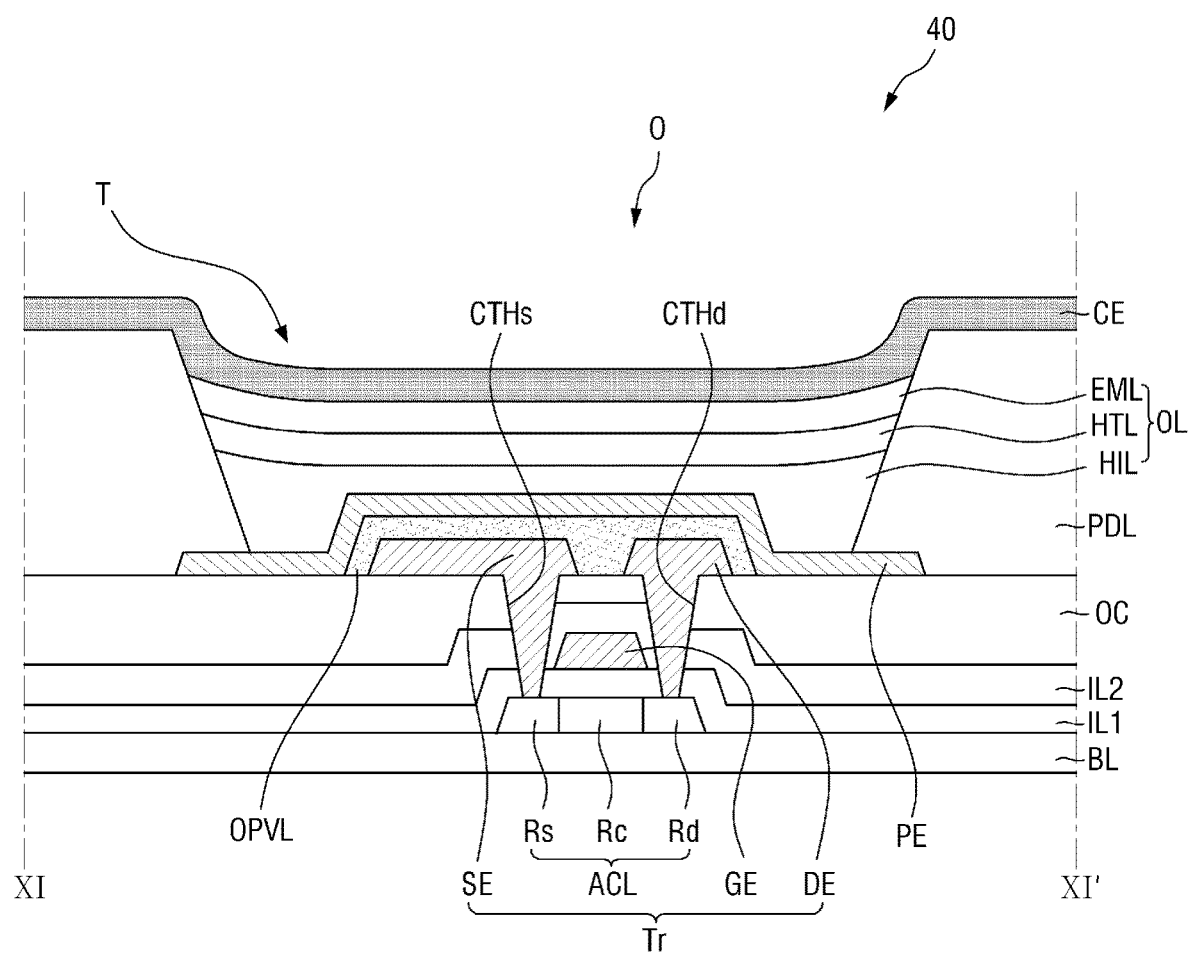
FIG. 11 is a cross-sectional view taken along the line XI-XI' of FIG. 10.

FIG. 10 is a plan view of a display device according to another embodiment of the present disclosure, and FIG. 11 is a cross-sectional view taken along the line XI-XI' of FIG. 10.

A display element 40 shown in FIGS. 10 and 11 is substantially the same as the display element 10 shown in FIGS. 4 and 5 except that a portion of an opening O overlaps with a TFT Tr. The display element 40 shown in FIGS. 10 and 11 will hereinafter be described so as to avoid redundant description of elements and/or features described above with respect to the display element 10 shown in FIGS. 4 and 5.

Referring to FIG. 10, the opening O may be disposed in a region defined by a plurality of gate lines GL and a plurality of data lines DL crossing each other, and a portion of the opening O may overlap with a TFT Tr.

Referring to FIG. 11, a semiconductor layer ACL, which is disposed on a base layer BL, a gate electrode GE, which is disposed on a first insulating layer IL1, and a source electrode SE and a drain electrode DE, which are disposed on a second insulating layer IL2, may form the TFT Tr. A planarization layer OC may be further disposed between the second insulating layer IL2 and the source electrode SE/the drain electrode DE. The semiconductor layer ACL may include a source region Rs, a drain region Rd, and a channel region Rc, which is interposed between the source region Rs and the drain region Rs. The source electrode SE and the drain electrode DE may be connected to the drain region Rd and the source region Rs, respectively, via a source contact opening (e.g., a source contact hole) CTHs and a drain contact opening (e.g., a drain contact hole) CTHd, respectively, which are formed to penetrate the first and second insulating layers IL1 and IL2, respectively.

The source electrode SE and the drain electrode DE may correspond to the metal pattern layer 201 shown in FIG. 2. Accordingly, a passivation film OPVL including an organic material may be disposed to planarize top surfaces of the source electrode SE and the drain electrode DE. As described above with reference to FIG. 2, the passivation film OPVL may be disposed only at an inner side (or center portion) of an opening O. The passivation film OPVL may cause a height difference between portions of a pixel electrode PE and, thus, trenches T may be formed in the opening O.

While the present invention has been particularly illustrated and described with reference to exemplary embodiments thereof, it will be understood by those of ordinary skill in the art that various changes in form and detail may be made therein without departing from the spirit and scope of the present invention as defined by the following claims and their equivalents. The exemplary embodiments described herein should be considered in a descriptive sense only and not for purposes of limitation.

What is claimed is:

1. A display element comprising:
a base substrate;
a metal layer on the base substrate;
a passivation film on the base substrate and covering the metal layer;
an electrode on the passivation film and at least partially overlapping the metal layer, the passivation film being between the metal layer and the electrode; and
a pixel defining film on the passivation film, the pixel defining film having an opening at least partially exposing the electrode,
wherein all of the portions of the electrode offset from the metal layer are below the portion of the electrode overlapping the metal layer in a cross-sectional view such that trenches are defined in the opening at positions offset from the metal layer.

2. The display element of claim 1, wherein a thickness of a portion of the passivation film covering the metal layer and a thickness of portions of the passivation film offset from the metal layer are substantially the same.

3. The display element of claim 2, wherein the passivation film comprises an inorganic material.

4. The display element of claim 1, further comprising an organic layer on the electrode in the opening, the organic layer being thicker in the trenches than outside the trenches.

5. The display element of claim 4, wherein the organic layer comprises a hole injection layer, a hole transport layer on the hole injection layer, and an emission layer on the hole transport layer, and
wherein the hole injection layer is thicker in the trenches than outside the trenches.

6. The display element of claim 1, wherein edge portions of the electrode are below the pixel defining film.

7. The display element of claim 1, wherein the metal layer is a gate metal layer or a data metal layer.

8. A display element comprising:
a base substrate;
a metal pattern layer on a surface of the base substrate and comprising a plurality of metal layers, the metal layers being spaced from each other;
a passivation film on the base substrate and covering the metal pattern layer;
an electrode on the base substrate and the passivation film and at least partially overlapping the passivation film, the passivation film being between the metal pattern layer and the electrode; and
a pixel defining film on the base substrate, the pixel defining film having an opening at least partially exposing the electrode,
wherein the passivation film is disposed in the opening and offset from the pixel defining film in a direction parallel to the surface of the base substrate, and
wherein portions of the electrode offset from the passivation film in the direction parallel to the surface of the base substrate are below a portion of the electrode that overlaps the passivation film such that trenches are defined in the opening.

9. The display element of claim 8, wherein a height of a top surface of a portion of the passivation film covering the metal pattern layer and a height of top surfaces of portions of the passivation film offset from the metal pattern layer are substantially the same.

10. The display element of claim 9, wherein the passivation film comprises an organic material.

11. The display element of claim 8, wherein the passivation film is only in the opening.

12. The display element of claim 8, further comprising an organic layer on the electrode in the opening,
wherein portions of the organic layer that are offset from the passivation film are thicker than a portion of the organic layer that overlaps the passivation film.

13. The display element of claim 12, wherein the organic layer comprises a hole injection layer, a hole transport layer on the hole injection layer, and an emission layer on the hole transport layer, and
wherein the hole injection layer is thicker in the trenches than outside the trenches.

14. The display element of claim 8, wherein edge portions of the electrode are below the pixel defining film.

15. The display element of claim 8, wherein at least one of the metal layers is a gate metal layer or a data metal layer.

16. A display element comprising:
a base layer;
a gate metal layer and a data metal layer on the base layer;
a passivation film on the gate metal layer and the data metal layer;
a pixel electrode on the passivation film and at least partially overlapping at least one of the gate metal layer and the data metal layer;
a pixel defining film on the base layer or the passivation film, the pixel defining film having an opening at least partially exposing the pixel electrode; and
an organic layer on the pixel electrode in the opening,
wherein a distance from a bottom surface of the base layer to a top surface of the pixel electrode is smaller at an edge portion of the pixel electrode in the opening than at a center portion of the pixel electrode in the opening, and
wherein the passivation film is entirely within a periphery of the opening.

17. The display element of claim 16, wherein the organic layer comprises a hole injection layer, a hole transport layer on the hole injection layer, and an emission layer on the hole transport layer, and
wherein the hole injection layer is thicker at an edge portion of the hole injection layer in the opening than at a center portion of the hole injection layer in the opening.

18. The display element of claim 16, wherein portions of the gate metal layer overlapping the pixel electrode are a gate line, and
wherein portions of the data metal layer overlapping the pixel electrode are a data line.

19. The display element of claim 16, wherein the pixel electrode at least partially overlaps the gate metal layer and the data metal layer, and
wherein portions of the gate metal layer overlapping the pixel electrode and portions of the data metal layer overlapping the pixel electrode together form a capacitor.

20. The display element of claim 16, wherein portions of the data metal layer overlapping the pixel electrode are a source electrode and a drain electrode.

* * * * *